United States Patent [19]
Lampen et al.

[11] 3,968,467
[45] July 6, 1976

[54] TOUCH CONTROLLED VOLTAGE-DIVIDER DEVICE

[75] Inventors: Stephen H. Lampen, San Francisco; William E. Hearn, Berkeley, both of Calif.

[73] Assignee: Stephen H. Lampen, San Francisco, Calif.

[22] Filed: Nov. 1, 1974

[21] Appl. No.: 519,825

Related U.S. Application Data

[62] Division of Ser. No. 394,161, Sept. 4, 1973, Pat. No. 3,895,288.

[52] U.S. Cl. .............................. 338/119; 219/501; 338/69; 338/196; 323/63
[51] Int. Cl.² ........................................ H01C 10/30
[58] Field of Search ............. 338/96, 69, 114, 119, 338/160, 161, 168, 186, 194, 196, 199; 340/365 S, 51; 200/46, 86 R, 159 B; 323/63, 79, 96; 343/7.3; 219/501

[56] References Cited
UNITED STATES PATENTS

| | | | |
|---|---|---|---|
| 2,543,373 | 2/1951 | Nesson | 338/119 |
| 2,777,925 | 1/1957 | Stolz | 338/196 X |
| 3,365,692 | 1/1968 | Sartain | 338/160 |
| 3,440,522 | 4/1969 | Kruse | 323/63 |
| 3,509,527 | 4/1970 | Oakes et al. | 200/86 R X |
| 3,568,113 | 3/1971 | Hopt et al. | 338/196 X |
| 3,610,887 | 10/1971 | Zetzer | 219/501 |
| 3,617,976 | 11/1971 | Campbell | 338/133 |
| 3,626,350 | 12/1971 | Suzuki et al. | 338/69 |
| 3,699,492 | 10/1972 | Yoshihara | 338/69 |

*Primary Examiner*—Volodymyr Y. Mayewsky
*Attorney, Agent, or Firm*—Phillips, Moore, Weissenberger, Lempio & Strabala

[57] ABSTRACT

A voltage divider device capable of providing any voltage in a preselected range of voltages, which voltage may be set by a touch of the finger is disclosed. The device includes a control element without frictional contacts and a voltage storage circuit controlled by the control element. A circuit including the device is described and embodiments of the device providing a visual indication of the setting of the device are disclosed.

2 Claims, 7 Drawing Figures

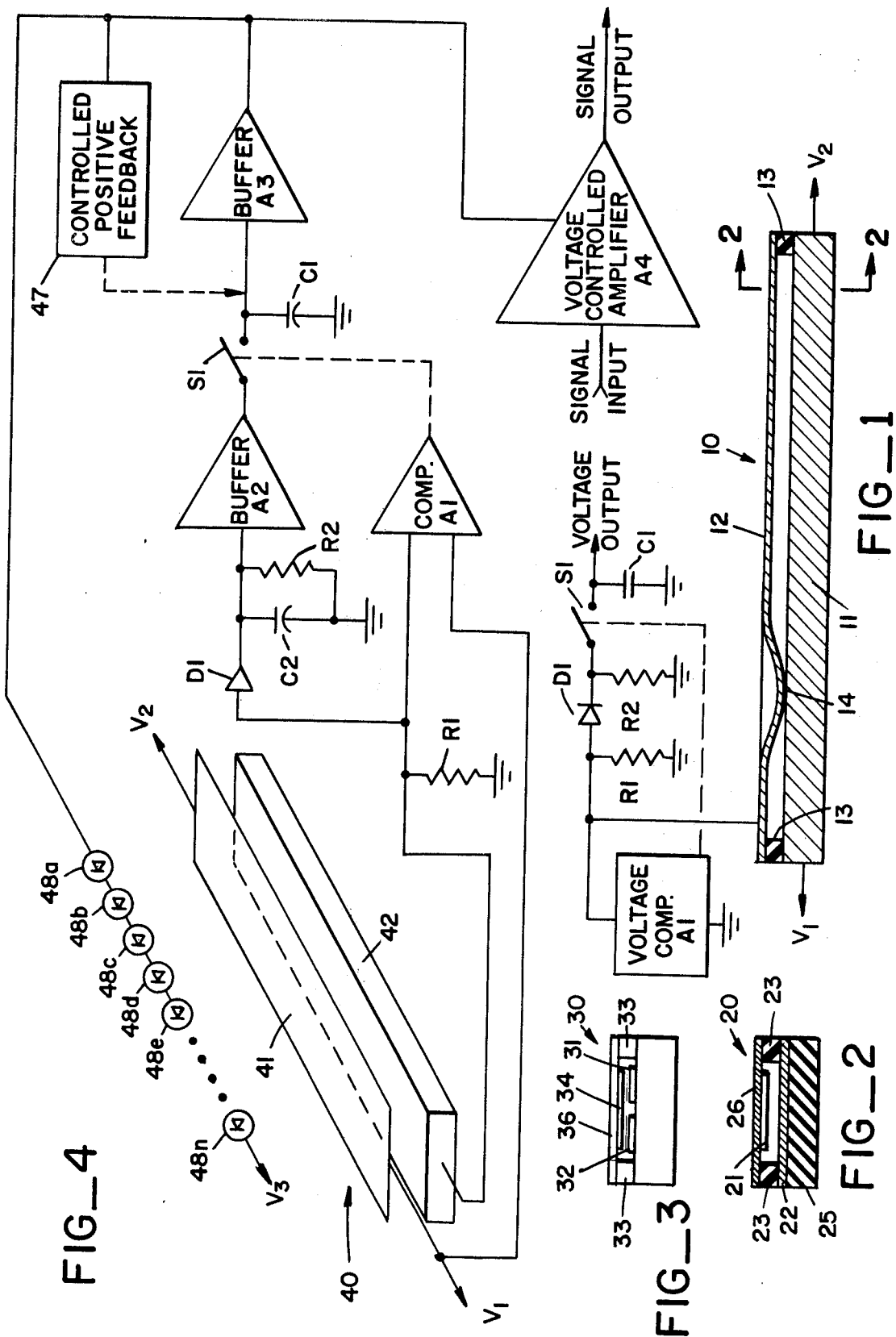

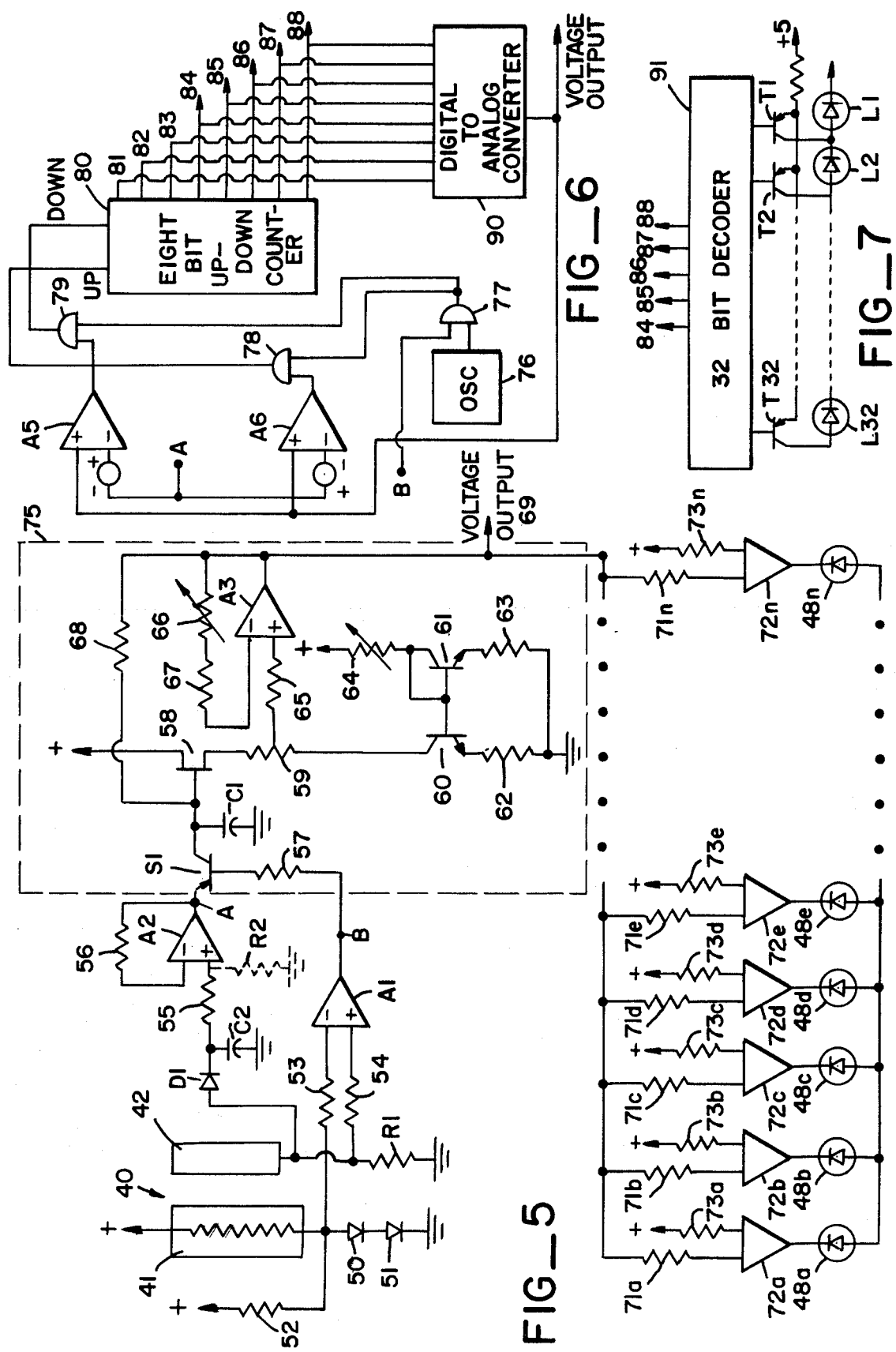

TOUCH CONTROLLED VOLTAGE-DIVIDER DEVICE

CROSS-REFERENCE TO RELATED APPLICATIONS

This application is a division of copending application, Ser. No. 394,161, filed Sept. 4, 1973, now U.S. Pat. No. 3,895,288 entitled "TOUCH CONTROLLED VOLTAGE-DIVIDER DEVICE".

BACKGROUND OF THE INVENTION

This invention relates to devices of the voltage-divider type, often referred to as potentiometers in connection with volume controls for audio amplifiers of various kinds, and more particularly to a voltage-divider device which can be controlled by a touch of the finger to provide a selected voltage within a preselected range of voltages.

In the prior art, volume controls have generally included an elongated resistance element having three terminals, one at each end of the resistance element and a third which is adjustable along the resistance element. Thus, if a given voltage difference is established across the resistance element by connecting opposite sides of a voltage source to the terminals at the ends of the resistance element, any desired voltage from that present at one end of the resistance element to that present at the other end of the resistance element may be obtained by proper adjustment of the third terminal along the length of the resistance element.

However, the adjustment of such third terminal according to the prior art required the physical movement of the third terminal along the resistance element usually by rotating a knob and often requiring complicated mechanical linkage between the knob and the third terminal. Furthermore, the electrical contact between the third terminal and the resistance element depended upon frictional contact therebetween. Thus, wearing of the device in use is inherent in such devices tending to result in faulty operation and eventually in failure of the device.

According to this invention a voltage-divider device is provided which does not rely on frictional contact between an adjustable terminal and a resistance element to select the voltage output thereof but which may be operated by a touch of the finger. Since there is no adjustable terminal to provide a visual indication of the setting of the voltage divider device, it is an object of this invention to provide a voltage responsive visual indication means physically associated with the resistance element of the voltage divider device to provide a visual indication of the setting thereof.

Briefly, according to this invention, a voltage-divider device comprising a resistive member having an elongated resistive surface and a conductive member having an elongated conductive surface mounted in close space substantially coextensive relationship with each other and means for selectively establishing galvanic contact between each of a plurality of points along the length of the resistive surface and a point corresponding thereto along the length of the conductive surface by a touch of the finger is provided with an elongated voltage responsive visual indication means physically located along the length of the elongated resistive and conductive surfaces in close spaced substantially coextensive relationship therewith. The elongated voltage responsive visual indication means is adapted to produce a different visual indication in response to each of a plurality of different voltages corresponding to each of the plurality of points along the length of the resistive and conductive surfaces. Terminal means for making electrical connection to opposite ends of the resistive surface and terminal means for making electrical connection to the elongated voltage responsive visual indication means are provided.

BRIEF DESCRIPTION OF THE DRAWING

This invention will be more fully understood from the following detailed description of a preferred embodiment thereof when read in conjunction with the drawing wherein:

FIG. 1 is a cross-sectional view of the control element of one embodiment of this invention with the electrical components of the embodiment shown partly in block diagram and partly in schematic form.

FIG. 2 is a cross-sectional view taken at a right angle to the view of FIG. 1 and of the control element of a different embodiment of this invention.

FIG. 3 is an end view of a control element of another embodiment of this invention.

FIG. 4 is a block diagram of a further embodiment of this invention.

FIG. 5 is a schematic representation of the embodiment of this invention shown in FIG. 4.

FIG. 6 represents the voltage storage means of yet another embodiment of this invention partly in schematic form and partly in block diagram form.

FIG. 7 represents a means for indicating the setting of a device according to the embodiment of FIG. 6.

DESCRIPTION OF THE PREFERRED EMBODIMENTS

Referring to FIG. 1 a simplified embodiment of the touch controlled voltage-divider device according to this invention is shown. The control element 10 of the device comprises an elongated resistive member 11 and an elongated conductive member 12. The control device 10 is shown in cross-section along the axis of elongation of the resistive element 11 and conductive element 12. As shown in FIG. 1 the resistive element 11 and conductive element 12 of the control element 10 are rigidly interconnected in substantially coextensive relationship by means of an insulating frame 13.

As indicated at 14 in FIG. 1 the conductive element 12 is flexible and the spacing between the resistive element 11 and the conductive element 12 as established by the insulating frame 13 is such that the conductive element 12 may be flexed to bring any point along the length of the lower surface thereof into contact with a corresponding point along the upper surface of the resistive element 11. The dimensions of the control element 10 are preferably selected so that a touch of the finger of the hand of the operator on the upper surface of the conductive element 12 will be sufficient to flex the conductive element 12 as indicated at 14 in FIG. 1 to bring a point on the lower surface thereof into contact with the corresponding point on the upper surface of the resistive element 11.

As indicated in FIG. 1 a voltage gradient is established along the length of the resistive element 11 of the control element 10 by connecting a first voltage V1 to one end thereof and a second voltage V2 to the other end thereof from a voltage source (not shown). In the embodiment shown in FIG. 1 the first voltage V1 is lower than the second voltage V2. Thus, when the conductive element 12 is flexed to establish galvanic contact with the resistive element 11, as indicated at 14, a voltage between voltages V1 and V2 will be applied to the conductive element 12. If the resistance of the resistive element 11 varies linearly from one end to the other thereof, then the voltage applied to the conductive element 12 by flexing it into galvanic contact with the resistive element 11 at successive points along its length will vary linearly between the voltage V1 at one end to the voltage V2 at the other end. It will be understood that the resistance of the resistive element 11 may vary other than linearly from one end to the other thereof, as desired, in which case a non-linear variation in voltage on the conductive element 12 will result as it is flexed into galvanic contact with the resistive element 11 at successive points from one end to the other thereof.

It will also be understood that both of the voltages, V1 and V2, may be either above ground potential or below ground potential or one of them may be at ground potential with the other either above or below ground potential. As shown in FIG. 1 both voltages, V1 and V2, are above ground potential and the conductive element is connected to ground through a resistance R1. Thus, the voltage applied to the conductive element 12 by flexing it into contact with the resistive element 11 at point 14 is developed across the resistor R1. Such voltage will be above voltage V1 and below voltage V2 as described above.

As shown in FIG. 1 the voltage developed across resistor R1 is applied both to a voltage comparator means A1 and to one contact of normally open switch means S1 through a diode D1. A resistor R2 is connected from the junction between diode D1 and switch means S1 to ground for purposes to be described below. The voltage comparator circuit A1 is adapted to close the normally open switch means S1 whenever a voltage with respect to ground is developed across the resistor R1.

As shown in FIG. 1 a voltage storage means in the form of a capacitor C1 is connected between the other contact of the switch means S1 and ground. Thus, whenever the switch means S1 is closed by the voltage comparator means A1 due to the presence of a voltage across the resistor R1, such voltage across the resistor R1 will be applied through the diode D1 to the resistor R2 and to the capacitor C1. If the voltage developed across R1 is higher than the voltage already existing on capacitor C1, the capacitor C1 will be charged to such higher voltage. However, if the voltage developed across the resistor R1 is lower than the voltage already existing on capacitor C1 then the capacitor C1 will discharge to ground through the resistor R2 to the value of the voltage developed across the resistor R1. The diode D1 prevents the voltage to which the capacitor C1 is charged from being applied to the voltage comparator means A1 and thus maintaining the switch means S1 closed even when there is no voltage applied to the conductive element 12.

As indicated in FIG. 1 the voltage to which the capacitor C1 has been charged provides the voltage output of the device. It will be understood that such voltage output may be utilized only in a manner not involving current flow which would discharge the capacitor C1.

Thus, it will be seen that the device shown in FIG. 1 will function as a voltage divider capable of providing any voltage output between V1 and V2 at the touch of a finger. It will also be seen that the voltage output of the device may be changed from one value to any other value within its range by a single substantially instantaneous manual movement which does not involve frictional contact between the conductive element 12 and resistive element 11 of the control element 10 or any mechanical linkage between the hand and such elements other than mere physical contact.

As shown in FIG. 1 the resistive element 11 of the control device 10 may comprise a block of carbon, for example, and the conductive element 12 of the control element 10 may comprise a metallic foil. However, it will be understood that the mechanical characteristics of the resistive element 11 and conductive element 12 of the control element 10 could be reversed by making the resistive element 11 flexible and the conductive element 12 rigid as indicated in FIG. 2.

As shown in FIG. 2 the control element 20 comprises a conductive element 22 in the form of a metallic plate mounted on the upper surface of an insulating block 25. The resistive element 21 of the control element 20 comprises a resistive coating on the lower surface of a resistive flexible film 26 which film is mounted above the metallic plate 22 by an insulating frame 23. Thus, any point along the resistive element 21 may be brought into contact with the corresponding point along the conductive element 22 by flexing the film 26 with a finger. However, the electrical connections to the resistive element 21 of the control element 20 will be the same as the electrical connections to the resistive element 11 of the control element 10 and the electrical connections to the conductive element 22 of the control element 20 will be the same as the electrical connections to the conductive element 12 of the control element 10.

It will be understood that it is not necessary for either the conductive element or the resistive element of a control element according to the teaching of this invention to be a solid body. Thus, either or both of such elements may be mere surfaces upon an insulating substrate as indicated in FIG. 2.

Furthermore, it is not necessary that either the resistive element or the conductive element of a control element according to the teaching of this invention be flexible. Thus, in the control element 30, according to another embodiment of this invention shown in FIG. 3, the resistive element 31 and the conductive element 32 may be placed side-by-side on an insulating substrate 35. The means for making galvanic contact therebetween may comprise the finger of the operator where the voltage and current involved is low. However, as shown in FIG. 3 it is preferred that such means comprise a conductive surface 34 on a flexible insulating film 36 mounted above such elements by an insulating frame 33. Thus, it will be seen that a touch of the finger on the insulating film 36 will bring the conductive means 34 into contact with both the conductive element 32 and the resistive element 31 bridging the gap therebetween and transferring the voltage present at the contact point from the resistive element 31 to the conductive element 32. Again, the electrical connections to the resistive element 31 of the control element 30 will be the same as that shown in FIG. 1 and the electrical connections to the conductive element 32 of the control element 30 will be the same as the electrical connections to the conductive element 12 of the control element 10 shown in FIG. 1.

It should be understood that the terms "resistive" and "conductive" are relative terms as applied to control elements according to the teaching of this invention. Thus, the essential feature of the resistive elements 11, 21 and 31 so far as this invention is concerned, is electrical resistance and the essential feature of the conductive elements 12, 22 and 32 is electrical conductance. However, although it is preferred that the resistive elements 11, 21 and 31 have greater electrical resistance than the conductive elements 12, 22 and 32, it is not essential that this relationship exist. It is essential that the resistance of resistor R1 be much larger than the electrical resistance of the conductive elements 12, 22 and 32. It would be desirable for the electrical resistance of the conductive elements 12, 22 and 32 to be as small as possible in order to enable the use of a capacitor C1 having a high capacitance which can be fully charged to the voltage desired in the shortest possible time. However, where a voltage storage means other than a capacitance is used, the electrical resistance of the conductive element 12 may not be a prime consideration.

The resistance of the resistive element 11 should be selected in order to provide a practical voltage gradient along a control element dimensioned for operation by the touch of a finger. It has been found that a coating of carbon on an insulating film, for example, will provide suitable resistance values for the resistance element of a control element, according to the teaching of this invention.

Referring to FIG. 4, a block diagram of a preferred embodiment of this invention is shown. The control element 40, according to this embodiment of the invention, comprises a resistive element 41 in the form of a continuous coating of carbon particles on a flexible insulating film and a conductive element 42 in the form of a strip of copper. The resistive element 41 is supported above the conductive element 42 by appropriate means (not shown) in a close-spaced substantially coextensive relationship thereto as described hereinabove. As also described hereinabove, a voltage gradient is established along the resistive element 41 by applying different voltages with respect to ground V1 and V2 to opposite ends thereof as indicated. A resistor R1 is connected between the conductive member 42 and ground. The conductive element 42 is also connected to one input of a voltage comparator A1 and one end of the resistive element 41 is connected to the other input of the voltage comparator A1. As described hereinabove, the voltage comparator A1 is adapted to close a normally open switch S1 whenever a voltage with respect to the ground is applied to the conductive member 42.

According to this embodiment of the invention, the conductive element 42 is connected to one of the contacts of the normally open switch S1 through a diode D1 and a buffer amplifier A2. An RC network comprising capacitor C2 and resistor R2 is connected to ground between the diode D1 and buffer amplifier A2. As described in connection with FIG. 1, the voltage storage capacitor C1 is connected between the other contact of the normally open switch S1 and ground.

It will be seen that by proper design of the voltage comparator A1 and proper selection of the diode D1 and RC network comprising capacitance C2 and resistance R2, it would be possible for the voltages V1 and V2 to be either direct current voltages or alternating current voltages in order to charge the capacitance C1 to a voltage corresponding to a particular point of contact between the resistive element 41 and conductive element 42 of the control element 40. However, in most applications V1 and V2 will be direct current voltages. The RC network comprising capacitance C2 and resistance R2 must have a time constant sufficient to insure that the charge on C1 will correspond to the selected voltage by compensating for any time lag in the opening of switch S1 when direct current voltages V1 and V2 are used to establish a voltage gradient across the resistive element 41 of the control element 40.

It will be understood that the switch means S1 could be a mechanical switch and the voltage comparator A1 could be a circuit including an induction coil or other means for mechanically actuating such switch provided that such circuit presents a high resistance between the conductive element 42 and ground. However, it is preferable to use an electronic switch means in order to reduce the time lag inherent in mechanical switch means to the order of about 50 milliseconds.

A second buffer amplifier A3 is connected to the other contact of the normally open switch S1 to enable the voltage stored on the capacitor C1 to be utilized. According to this embodiment of the invention, a portion of the output of the second buffer amplifier A3 is fed back to its input in order to maintain the charge on the capacitor C1.

It will be understood that any capacitor will have a certain amount of internal resistance or leakage tending to cause any charge applied thereto to slowly decrease with time. By proper design of the controlled positive feed-back means 47 the charge on the capacitor C1 may be maintained constant over an extended period of time.

Thus, it will be seen that the voltage output of the buffer amplifier A3 may be set by a touch of the finger on the resistive element 41 of the control element 40, bringing it into contact with the conductive element 42. Such voltage output of the buffer amplifier A3 will remain constant until reset by a further touch of the finger bringing a different point along the length of the resistive element 41 into contact with the conductive element 42 of the control element 40.

The voltage output of the buffer amplifier A3 may be utilized in various ways. According to the embodiment of the invention shown in FIG. 4, such voltage output is used as the control voltage for a voltage controlled amplifier A4 in an audio amplifier system. Thus, the magnitude of the audio signal output of the voltage controlled amplifier A4 may be set by a touch of the finger on the resistive element 41 of the control element 40, which will set the voltage output of the buffer amplifier A3 as described above, thereby setting the amount of amplification of the audio signal input to the voltage controlled amplifier A4. Such setting will remain fixed until a further touch of the finger to the control element 40 bringing a different point along the resistive element 41 thereof into contact with the conductive element 42.

As shown in FIG. 4, a means for visually indicating the setting of the control element 40 is also provided. According to this embodiment of the invention, such means for indicating the setting of the voltage control element may comprise a string of light emitting diodes 48a-48n. Such light emitting diodes are physically located along the length of the control element 40 and are electrically interconnected in such a way that they will each begin to emit light when a different threshold voltage is reached. As indicated in FIG. 4, the voltage output of the buffer amplifier A3 is applied to the string of light emitting diodes. Thus, assuming the voltage V1 to be lower than the voltage V2, the string of light emitting diodes 48a-48n is designed so that the light emitting diode 48n will be lighted when the voltage at the output of the buffer amplifier A3 corresponds to the voltage applied to the conductive element 42 of the control element 40 by touching the finger to the end of the resistive element 41 to which the voltage V1 is connected and such that all of the light emitting diodes 48a-48n are lighted when the voltage output of the buffer amplifier A3 corresponds to the voltage applied to the conductive element 42 of the control element 40 by a touch of the finger to the end of the resistive element 41 to which the voltage V2 is connected. It will be understood that the string of light emitting diodes is designed so that a touch of the finger to the control element 40 at a point between its ends will cause the light emitting diodes from 48n to the light emitting diode (48c, for example) physically located adjacent the point of contact, to be llghted with the remaining light emitting diodes 48a and 48b remaining dark. It is, of course, necessary that voltage V3, to which the string of light emitting diodes is connected, be properly selected in relation to the range of voltage outputs of the buffer amplifier A3 to accomplish the above result. Thus, it will be seen that a visual indication of the setting of the control element 40 is provided by the string of light emitting diodes. It would, of course, be possible to utilize other visual means to indicate the voltage output of buffer amplifier A3 and thus the setting of the control element 40. However, it is preferred that such visual indicating means be physically associated with the control element 40 and that it provide a rectilinear presentation conforming to the rectilinear nature of the control element 40.

Referring to FIG. 5, a schematic diagram of the embodiment of this invention shown in FIG. 4 is presented by way of example. The reference numerals of FIG. 4 have been applied to FIG. 5 for ease in comparing the schematic diagram of FIG. 5 with the block diagram of FIG. 4.

One end of the resistive element 41 of the control element 40 is connected to a power supply which may provide a positive direct current voltage of 10 volts, for example. The other end of the resistive element 41 is connected to the anode of a germanium diode 50 which may be of the type sold under the designation 1N34, for example. The cathode of the diode 50 is connected to the anode of silicon diode 51 which may be of the type sold under the designation 1N914, for example, and the cathode of which is connected to ground.

Such other end of the resistive element 41 is also connected to the power supply (not shown) which provides a positive direct current voltage of 10 volts through a resistor 52 which may have a value of 10K ohms, for example. Finally, such other end of the control element 51 is connected to the negative input terminal of the voltage comparator A1 through a resistance 53 which may have a value of 3.3 megohms, for example. Thus, it will be seen that a constant reference voltage is present at such one end of the resistive element 41 of the control element 40 which reference voltage is applied to the negative input terminal of the voltage comparator A1. The circuitry of the voltage comparator A1 is such that its negative terminal is connected to ground through a silicon diode. Thus, the series connected germanium diode 50 and silicon diode 51 will insure that such reference voltage is slightly positive with respect to ground.

The conductive element 42 of the control element 40 is connected to ground through resistor R1 which may have a value of 1 megohm, for example. The conductive element 42 of the control element 40 is also connected to the positive input terminal of voltage comparator A1 through a resistor 54 which may have a value of 1 megohm, for example. Finally, the conductive element 42 of the control element 40 is connected to the anode of silicon diode D1 which may be of the type sold under the designation 1N914, for example.

Thus, it will be seen that when galvanic contact is established between the conductive element 42 and a point on the resistive element 41 of the control element 40, a voltage corresponding to the point of contact will be developed across resistor R1 and applied to the positive input terminal of the voltage comparator A1 through the resistor 54. Such voltage will also be applied to the anode of the diode D1.

The cathode of the diode D1 is connected to the positive input terminal of the buffer amplifier A2 through a resistor 55. The cathode of diode D1 is also connected to ground through the capacitor C2 which may have a value of 0.1 microfarad, for example. According to this embodiment of the invention, the resistor R2 is inherent in the circuitry of the buffer amplifier A2 as indicated by the resistor shown in phantom between the positive input of such buffer amplifier A1 and ground in FIG. 5. The value of the capacitor C2 is selected to provide the desired time constant as discussed hereinabove. The resistor 56 connected between the output of the buffer amplifier A2 and the negative input thereof has a value selected to set the gain of such amplifier at substantially unity which may be 560 K ohms, for example.

According to the embodiment of the invention shown in FIG. 5 the switch S1 is a transistor which may be of the type sold under the type designation 2N3638 and the capacitor C1 has a value of 10 microfarads and a voltage rating of 20 volts. The output of the voltage comparator A1 is connected to the base of the transistor S1 through a resistor 57 which may be 4.7K ohms, for example. The output of the buffer amplifier A2 is connected to the emitter of the transistor S1 and one terminal of the capacitor C1 is connected to the collector of the transistor S1, the other terminal of the capacitor C1 being connected to ground. Thus, it will be seen that the transistor S1 will be biased into its conducting state by the output of the voltage comparator A1 whenever a voltage is applied to the conductive element 42 of the control element 40. At the same time, such voltage applied to the conductive element 42 of the control element 40 will be applied to the capacitor C1 through the diode D1, amplifier A2 and transistor S1. It will be understood that if the voltage applied to the conductive element 42 of the control element 40 is lower than the voltage already existing on the capacitor C1, then the capacitor C1 will discharge to such voltage through the transistor S1 and the inherent resistance R2 of the buffer amplifier A2.

The voltage charge existing on the capacitor C1 is also applied to the control element of a field effect transistor 58 which may be of the type sold under the designation 2N3819, for example. It will be understood that the voltage on the capacitor C1 when applied to the control element of the field effect transistor 58 will establish a certain voltage drop across such field effect transistor corresponding to the voltage on the capacitor C1. One side of the field effect transistor 58 is connected to a power supply (not shown) and the other side of the field effect transistor is connected to ground through the tapped resistor 59 which may have a value of 10K ohms, for example, and a constant current network comprising transistors 60 and 61 and resistors 62, 63, and 64.

Thus, it will be seen that the voltage tapped from resistor 59 at a preselected setting thereof will vary in proportion to the voltage on the capacitor C1. The voltage tapped from resistor 59 is applied through resistor 65 having a value of 1 megohm, for example, to the positive input of operational amplifier A3. The output of operational amplifier A3 is connected to the negative input thereof through an adjustable resistor 66 and a fixed resistor 67. The values of the adjustable resistor 66 and resistor 67 are such that the resistor 66 may be adjusted to provide a gain slightly greater than unity through the operational amplifier A3. This enables a portion of the output of the operational amplifier A3 to be fed back to the capacitor C1 through a resistor 68 which may have a value of 10 megohms, for example, in order to maintain the voltage on such capacitor C1 constant in spite of any internal resistance that may be inherent in such capacitor tending to result in leakage of the charge thereon to ground.

The output of the operational amplifier A3 constitutes the output of the device as indicated at 69. It will be understood that such output may be used to control a voltage controlled amplifier, as discussed in connection with FIG. 4, in which case the voltage comparator A1, buffer amplifiers A2 and A3 and voltage controlled amplifier A4 may each comprise a different quarter section of an integrated circuit of the type sold under the NATIONAL trademark and designated LM3900.

However, such output may also be used to control substantial amounts of current by applying it to silicon-controlled rectifier devices, for example. In fact, it is believed that the device shown in FIG. 5 may be used in any application in which conventional voltage divider devices have heretofore been used.

As shown in FIG. 5 the output of the device is also applied to a network of light emitting diodes 48a-48n which may be of the type sold under the LITRONIX trademark and designated 209 and which have a spatial relationship to the control device 40 as discussed in connection with FIG. 4. As shown in FIG. 5 the output of the device is applied to each light emitting diode independently through a different one of a plurality of resistors 71a-71n and a different one of a plurality of voltage comparator circuits 72a-72n. It will be understood that each of the voltage comparator circuits 72a-72n is connected to a common power supply (not shown) through a different one of a plurality of resistors 73a-73n, each of which has a different value thus establishing a different comparison voltage associated with each light emitting diode. By proper selection of the resistors 73a-73n the network may be adapted so that the light emitting diodes 48a-48n are turned on, one after another, by the voltage comparator circuits 72a-72n associated therewith as the voltage output of the device increases from its minimum to its maximum value. Similarly, the light emitting diodes will be turned off, one after another, as the voltage output of the device decreases from its maximum to its minimum value. Thus, the voltage output selected by a touch of the finger to the resistive element 41 of the control element 40 bringing a point therealong into contact with the conductive element 42 will cause a corresponding change in the number of consecutive light emitting diodes which are active thereby providing a visual indication of such setting of the device as discussed in connection with FIG. 4 above.

As mentioned above, all capacitors have a certain inherent internal resistance resulting in a leakage of the charge thereon to ground over a period of time. The provision of a feedback voltage through resistor 68 as discussed hereinabove will, of course, tend to maintain such charge constant over a substantial period of time. However, it is difficult to provide and maintain an exact balance between the gain of the amplifier A3 and the leakage of the capacitor C1 and even if such balance is obtained it may be lost during the life of the device due to changing values of the various components involved.

Referring to FIG. 6 another embodiment of this invention is shown in which a digital voltage storage and output circuit is substituted for the switch S1, capacitor C1 and buffer amplifier circuit of the embodiment shown in FIG. 5. Thus, the digital voltage storage and output circuit shown in block diagram form in FIG. 6 may be substituted for the portion of the circuit shown in FIG. 5 which is enclosed by the dotted line 75.

Referring to FIG. 6 the output of the buffer amplifier A2 which is labeled A in FIGS. 5 and 6 may be applied to the negative inputs of each of a pair of voltage comparators A5 and A6 which are offset from each other by a small voltage represented in FIG. 6 as ideal generators $E_1$ and $E_2$. A conventional digital clock or oscillator 76 is provided having its output connected to one input of a conventional gate 77. The output of the voltage comparator A1, labeled B in FIGS. 5 and 6, is connected to the other input of the gate 77 and the output of the gate 77 is connected to one of the inputs of each of a pair of gates 78 and 79.

As shown in FIG. 6 the output of the voltage comparator A6 is connected to the other input of the gate 78 and the output of the voltage comparator A5 is connected to the other input of the gate 79. The output of the gate 78 is applied to the "up" terminal of a conventional 8 bit up-down counter 80 and the output of the gate 79 is applied to the "down" terminal of such counter 80.

The output lines 81–88 of the counter 80 are connected to a conventional digital to analog converter 90. The output of the digital to analog converter 90 provides both the output of the device and the input to the positive terminals of the voltage comparators A5 and A6. It will be understood that the digital to analog converter 90 will have a certain minimum output corresponding to a one count of the 8 bit up-down counter 80.

The appearance of a voltage at the inputs A and B, produced by bringing the resistive element 41 of a control element 40 into contact with a conductive element 42 thereof, will open the gate 77 applying the output of the clock 76 to one of the inputs of each of the gates 78 and 79. At the same time the voltage input A will be compared to the voltage output of the digital to analog converter 90. If the voltage at input A is higher than the input of the digital to analog converter 90, the voltage comparator A6 will apply a signal to the other input of gate 78 opening such gate and applying the output of the clock 76 to the "up" terminal of the 8 bit up-down counter 80. The counter 80 will begin to count in an upward direction thereby raising the output of the digital to analog converter until it equals the voltage input A. At this point the output of voltage comparator A6 will tend to be cut off and voltage comparator A5 will tend to produce an output.

It will be understood that an output from the voltage comparator A5 will open the gate 79, applying the output of the clock 76 to the "down" terminal of the 8 bit up-down counter 80. Thus, if a lower voltage is subsequently applied to inputs A and B the 8 bit up-down counter 80 will count down to produce an output from the digital to analog converter 90 corresponding to such lower voltage. The offset voltage provided by ideal generators E1 and E2 may be set to correspond to the least significant digit of the 8 bit up-down counter 80.

As soon as the operator's finger is removed from the control element 40 the voltages at inputs A and B will disappear and the 8 bit up-down counter 80 will remain at a constant count within one or two least significant digits of the count corresponding to the last voltage present at the input A. This in turn will result in a constant voltage output from the digital to analog converter 90 providing a constant voltage output from the device corresponding to the last voltage present at the input A, which output will remain constant until a new voltage setting is established by touching a different point on the control element 40 to apply a different voltage to inputs A and B.

It will be understood that the output of the digital to analog converter 90 could be applied to a network of light emitting diodes as shown in FIG. 5. However, as shown in FIG. 7 the visual indication of the setting of the device may also be conveniently provided by applying the outputs 84-88 of the 8 bit up-down converter 80, corresponding to the five most significant digits, to a conventional 32 bit decoder 91. Each of the 32 outputs of the 32 bit decoder 91 is applied to the base of a different one of a plurality of transistors T1-T32. According to this embodiment of the invention all of the light emitting diodes L1-L32 are connected in series with the cathode of the first light emitting diode L1 being connected to the negative terminal of a power supply (not shown) and the anode of the last light emitting diode L32 connected to the collector of the transistor T32 which has its base connected to the output of the 32 bit decoder 91 corresponding to the most significant digit. The emitters of all of the transistors T1-T32 are connected in parallel to the positive terminal of a voltage supply (not shown). The collector of the transistor T1 is connected to the anode of L1, the collector of the transistor T2 is connected to the anode of L2 and so forth, through transistors T32 and L32. Thus, as shown in FIG. 7 the appearance of an output at any one of the 32 outputs of the 32 bit decoder 91 will light up all of the light emitting diodes L1-L32 to the right of such output of the decoder 91.

The arrangement of the light emitting diodes L1-L32 as shown in FIG. 7 in proper sequential spaced relation to the control element 40 will thus provide a visual indication of the setting of such control element as discussed hereinabove. This arrangement of light emitting diodes has the advantage of limiting the current which must be provided by the power supply to that required to light a single light emitting diode.

It is believed that those skilled in the art will adapt the various embodiments of the device disclosed herein to various applications by making obvious modifications therein to suit the particular application. In any event, it is believed that the various embodiments of the device disclosed herein may be adapted for use in any application where conventional voltage-divider devices are now being used without departing from the scope of this invention as set forth in the following claims.

What is claimed is:

1. In a voltage-divider device:
   a. a resistive member having an elongated resistive surface;
   b. a conductive member having an elongated conductive surface mounted in close spaced substantially coextensive relationship with said resistive surface;
   c. means for selectively establishing galvanic contact between each of a plurality of points along the length of said resistive surface and the point corresponding thereto along the length of said conductive surface by a touch of the finger;
   d. elongated voltage responsive visual indication means physically located along the length of said elongated resistive and conductive surfaces in close spaced substantially coextensive relationship therewith and adapted to produce a different visual indication in response to each of a plurality of different voltages corresponding to each of said plurality of points along the length of said resistive surface;
   e. terminal means for making electrical connection to opposite ends of said elongated resistive surface; and
   f. terminal means for making electrical connection from the conductive member to said elongated voltage responsive visual indication means.

2. In a voltage-divider device as claimed in claim 1 said elongated voltage responsive visual indication means comprising an elongated array of a plurality of light emitting diodes each physically located in close spaced relationship with a different one of said plurality of points along the length of said resistive surface.

* * * * *